United States Patent
Todt et al.

(12) 
(10) Patent No.: US 6,648,967 B2
(45) Date of Patent: Nov. 18, 2003

(54) CRYSTAL-PULLING APPARATUS FOR PULLING AND GROWING A MONOCRYSTALLINE SILICON INGOT, AND METHOD THEREFOR

(75) Inventors: Volker R. Todt, Salem, OR (US); Rocky Oakley, Salem, OR (US); Peter Wildes, Salem, OR (US); Fritz Kirscht, Gent (BE); Haresh Siriwardane, Salem, OR (US); Joel Kearns, Salem, OR (US)

(73) Assignees: Mitsubishi Materials Silicon Corporation, Tokyo (JP); Mitsubishi Silicon America Corporation, Palo Alto, CA (US)

( * ) Notice: Subject to any disclaimer, the term of this patent is extended or adjusted under 35 U.S.C. 154(b) by 0 days.

(21) Appl. No.: 09/989,352

(22) Filed: Nov. 20, 2001

(65) Prior Publication Data

US 2003/0084840 A1 May 8, 2003

(30) Foreign Application Priority Data

Nov. 7, 2001 (JP) ........................................ 2001-342002

(51) Int. Cl.[7] .............................................. C30B 35/00
(52) U.S. Cl. ........................ 117/218; 117/208; 117/217; 117/900
(58) Field of Search ................................ 117/13, 19, 20, 117/208, 217, 218, 900

(56) References Cited

U.S. PATENT DOCUMENTS 5,047,113 A * 9/1991 Ostrogorsky ................. 117/81
6,117,230 A * 9/2000 Ammon et al. ............... 117/13

* cited by examiner

Primary Examiner—Felisa Hiteshew
(74) Attorney, Agent, or Firm—Reed Smith LLP (57) ABSTRACT

A crystal-pulling apparatus for pulling and growing a monocrystalline silicon ingot comprises a quartz crucible placed in a chamber and containing a silicon melt from which a monocrystalline silicon ingot will be pulled, a graphite crucible container to support the quartz crucible by surrounding the outer circumferential surface and external base surface of crucible, and a heater provided around the outer circumferential surface of the crucible container to heat the silicon melt. This apparatus further comprises a spacer having a top surface whose area is smaller than the base area of the quartz crucible and having a melting point higher than that of silicon, is inserted between the base of the quartz crucible and the base of the crucible container while the monocrystalline silicon ingot is pulled. According to this invention, it is possible to obtain an N-type monocrystalline silicon ingot heavily doped with impurities and having a low resistivity in which the oxygen concentration is desirably controlled, or it is possible to obtain a monocrystalline silicon ingot of which the seed end retains an oxygen concentration determined by natural equilibrium conditions, while the cylindrical portion and tail end contain a relatively constant oxygen concentration, being relieved of a sharp fall in oxygen supply which is observed in a conventional apparatus.

14 Claims, 11 Drawing Sheets

Prior Art

Fig.13

Prior Art

CRYSTAL-PULLING APPARATUS FOR PULLING AND GROWING A MONOCRYSTALLINE SILICON INGOT, AND METHOD THEREFOR

This application claims Paris Convention priority of Japanese Application No. 2001-342002 filed Nov. 7, 2001, the complete disclosure of which is hereby incorporated by reference.

BACKGROUND OF THE INVENTION

1. Field of the Invention

The present invention relates to a crystal-pulling apparatus for pulling and growing a monocrystalline silicon ingot according to the Czochralski method (CZ method hereinafter), and a method therefor.

2. Description of the Related Art

The CZ method has been employed as one of the methods for growing silicon single crystals. The CZ method proceeds as follows. Firstly, a polycrystalline silicon material is heated in a quartz crucible to a temperature higher than the melting point of that silicon material, to give a silicon melt. Then, a seed crystal is dipped into the silicon melt kept in the quartz crucible. After the seed crystal has been dipped and itself partially melted, pulling of the seed is started. During pulling, first a thin crystal section, called a neck, is grown to eliminate dislocation growth into the ingot. Then a crystalline ingot is developed from the neck as the crystal is allowed to increase its diameter gradually, so that first a cone-shaped portion, next a shoulder portion, and then a cylindrical portion with a uniform diameter may be formed. The crystalline seed, after having undergone the above steps, grows into a monocrystalline silicon ingot in the form of a solid cylinder.

While a silicon crystal grows according to the CZ method, the internal wall of a quartz crucible is in contact with the silicon melt and will gradually dissolve as a result of the reaction as represented by the following formula (1).

$$SiO_2 + Si \rightarrow 2SiO \qquad (1)$$

Figure 12:
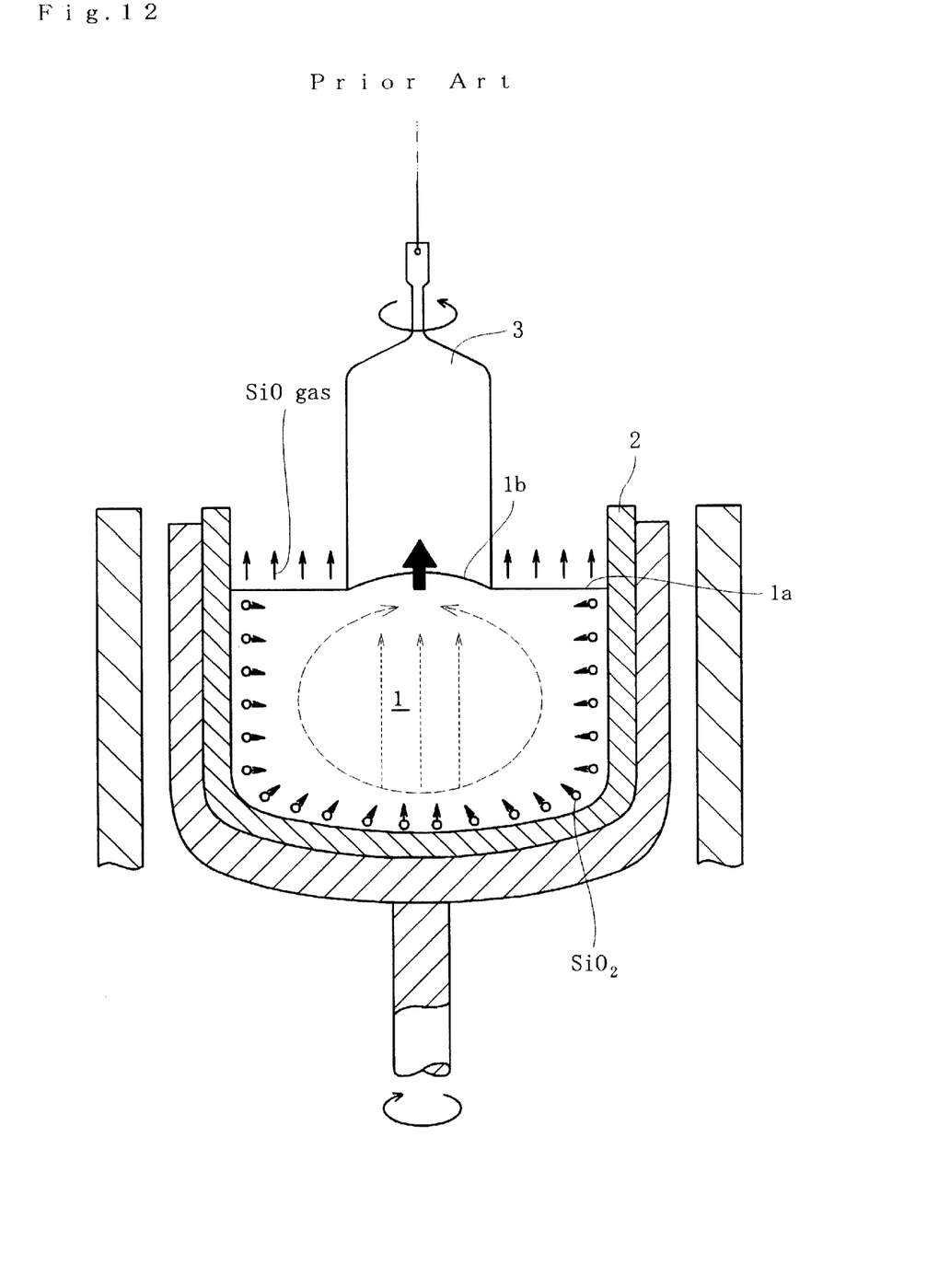
FIG. 12 shows, in a conventional crystal-pulling apparatus, how oxygen transfers by dissolution from the internal wall of a quartz crucible to a silicon melt kept in the crucible.
Figure 13:
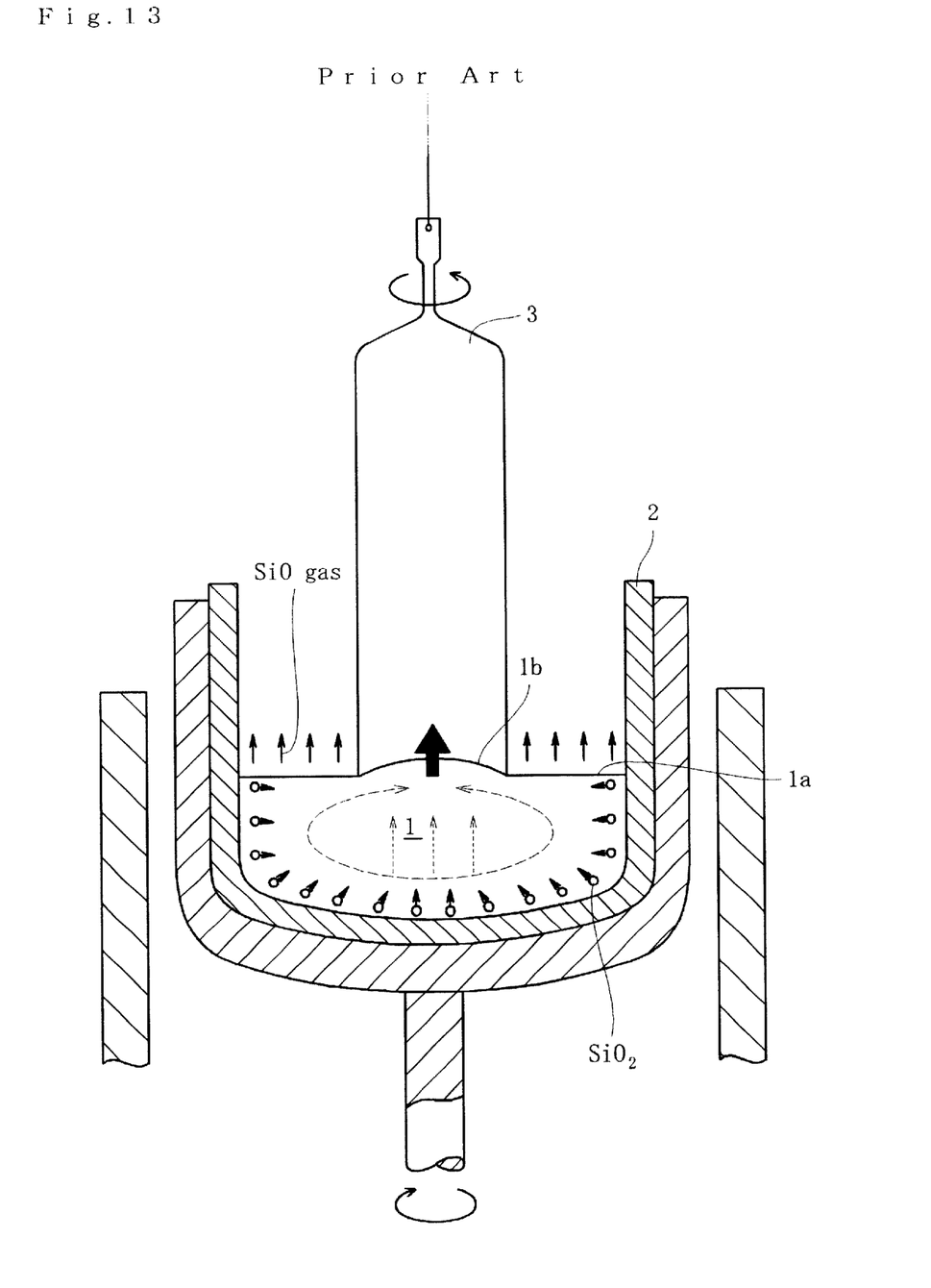
FIG. 13 shows, in a manner corresponding to FIG. 12, how oxygen transference from the internal wall of the quartz crucible to a silicon melt occurs when the surface of the silicon melt lowers in association with the pulling of a monocrystalline silicon ingot.

As shown (FIG. 12), the majority of SiO dissolving into the silicon melt (1) will evaporate, as SiO gas, from the free surface 1a of the silicon melt (1), whereas a small amount thereof will be incorporated through the solid-liquid interface (1b) into the monocrystalline silicon ingot (3), to supply the ingot with oxygen which is an impurity. During the early phase of pulling, the contact area between the silicon melt (1) and the internal wall of the quartz crucible (2) is comparatively large, and thus the concentration of oxygen dissolving into the silicon melt (1) becomes very high. However, when the crystal growth process advances and a monocrystalline silicon ingot (3) starts to form as shown (FIG. 13), the surface (1a) of the silicon melt (1) gradually drops, and the contact area between the silicon melt (1) and the internal wall of the quartz crucible (2) becomes smaller compared with what is observed during the early phase of pulling. The reduction of the contact area between the crucible and the melt will cause the concentration of the oxygen transferring from the crucible (2) into the silicon melt (1) to decrease. Accordingly, a fully grown monocrystalline silicon ingot (3) will show an uneven oxygen distribution along its longitudinal axis: more specifically, the oxygen concentration will vary depending on whether the oxygen measurement is made at the seed end of the crystal, in the mid portion of the crystal, or at the tail end of the crystal.

N-type monocrystalline silicon ingot which is heavily doped with an element such as As, P or Sb is favored as a starting material for epitaxial wafers (epi-wafers hereinafter) used in the power discrete market, and its production tends to increase. Two of the essential requirements for a good epi-wafer substrate are its bulk resistivity and its intrinsic gettering capability. The intrinsic gettering capability of a wafer is closely related to the intrinsic oxygen concentration that has been grown into the crystalline structure. It was found in the past that there is a direct correlation between the bulk resistivity of a N-type silicon crystal and the oxygen concentration of such a heavily doped N-type monocrystalline silicon crystal. The lower the resistivity of a specific crystal is, the lower is the oxygen concentration that a crystal incorporates naturally into the crystal structure. The reason for this behavior is partially that elements such as As and Sb evaporate easily from the free surface of the melt while forming oxygen compounds, therefor reducing the oxygen amount in the melt. Take antimony (Sb) as an illustration. If Sb is in a silicon melt, it will bind with oxygen transferred to the melt, to encourage the further dissolution of oxygen, and then it will evaporate alone or as a compound in the form of $Sb_2O$. As a result, if a silicon melt contains a high concentration of Sb, the concentration of coexistent oxygen will decrease, and thus it is difficult to achieve high oxygen incorporation into the a heavily doped Sb-type crystal. As seen above, it has been difficult to obtain an N-type monocrystalline silicon ingot that presents a low resistivity and a high oxygen concentration simultaneously.

SUMMARY OF THE INVENTION

An object of this invention is to provide a crystal-pulling apparatus for pulling and growing a monocrystalline silicon ingot whereby it is possible to produce a heavily doped N-type monocrystalline silicon while adjusting the oxygen concentration of the ingot to a desired level, and a method therefor.

A further object of this invention is to provide a crystal-pulling apparatus for pulling and growing a heavily doped N-type monocrystalline silicon ingot whereby it is possible to produce a monocrystalline silicon ingot whose oxygen concentration at the seed end is kept at a level determined by natural equilibrium conditions, while the reduction in oxygen concentration at the cylindrical portion and at the tail end which would be otherwise introduced, is effectively restrained, and a method therefor.

A first aspect of this invention relates to an improved crystal-pulling apparatus for pulling and growing a monocrystalline silicon ingot comprising, within a chamber, of a quartz crucible containing a silicon melt from which a monocrystalline silicon ingot will be pulled; a graphite crucible container which surrounds the outer wall of the crucible at the external base surface of the quartz crucible to support it; and a heater which surrounds the outer wall of the crucible container and is intended to heat the silicon melt. Its constitution has a further notable feature: a spacer which has a top area smaller than the area of the external base surface of the quartz crucible and consists of a material having a higher melting point than that of silicon, is inserted between the external base surface of the quartz crucible and the internal base surface of the crucible container while a seed crystal is pulled to produce a monocrystalline silicon ingot.

According to the first aspect of this invention, a specific property characteristic of the quartz crucible, that is, softening of a quartz during the pulling of a monocrystalline silicon ingot is utilized. When a quartz crucible softens, being heated by a heater to the softening temperature, the base of the quartz crucible will gradually undergo deformation, so that because of its own weight and the weight of the silicon melt kept in the crucible, the a gap formed between the crucible and the crucible container, will be abolished. If the quartz crucible starts to deform, its base will gradually become convex upwards, and thus the internal base area of the crucible will increase. The increased internal base area of the crucible will cause the area of the internal base of the quartz crucible in contact with the silicon melt to increase. Further, because then the silicon melt is raised upwards relative to a given level on the internal wall of crucible, provided that other things remain invariable, the surface of the silicon melt relative to the internal side-wall of crucible would be also raised. This implicit elevation of the surface of the silicon melt will retard the downfall of the same surface which will be brought about in association with the pulling of a monocrystalline silicon ingot. Thus, the downfall of the surface of the silicon melt observed during the formation of a silicon crystal ingot, particularly during the formation of the cylindrical part of the ingot will proceed at a slower pace than would be otherwise observed. Additionally to the increase in the melt-crucible interface a variation in the flow pattern of the melt will occur, due to the change of the crucible bottom shape.

A second aspect of this invention relates to a crystal-pulling apparatus for pulling and growing a monocrystalline silicon ingot comprising a plurality of openings formed on the base of the crucible container symmetrically around the center of the same base, the plurality of spacers fitted to the openings, and a spacer disposing means for raising and lowering the spacers, wherein the plurality of spacers can be raised to a same height above the openings or sunk to a same level in the openings by the spacer disposing means.

According to the second aspect of this invention, if the apparatus is so operated as to cause the base of the quartz crucible to be raised according to the pulling length of a monocrystalline silicon ingot, the base of the quartz crucible will be deformed to have a more enhanced upward convexity than would be otherwise observed. Through this deformation, the surface area of the internal base of the quartz crucible will increase, and thus the area of the internal base of the quartz crucible in contact with the silicon melt will increase. Further, the surface of the silicon melt would be raised through this deformation provided other things remain invariable. Therefore, it will be possible to control the sinking speed of the surface of the silicon melt which will be inevitably brought about in association with the pulling of a monocrystalline silicon ingot, by introducing and adjusting this implicit elevation of the surface of the silicon melt according to the pulling length of a monocrystalline silicon ingot.

Additionally to the increase in the melt-crucible interface a variation in the flow pattern of the melt will occur, due to the change of the crucible bottom shape. The shape change can be controlled by introducing and adjusting the implicit elevation of the surface of the internal base and by selecting various different shapes and numbers for the plurality of spacers.

In summing up, according to this invention, it is possible:

to increase the surface area of internal base of a quartz crucible by emphasizing the upward convexity of that base, thereby enlarging the area of the same base in contact with a silicon melt, to elicit, if other things remain invariable, an elevation of the surface of a silicon melt which will increase the area of the internal wall of the quartz crucible in contact with the silicon melt, this implicit elevation of the surface of the silicon melt diminishing the speed at which the contact area in question is reduced, which is brought about in association with the pulling of a monocrystalline silicon ingot, to change the flow pattern in the silicon melt by elevating and changing the internal wall shape at the bottom of the crucible in a way that the flow of high oxygen melt to the crystal melt interface is increased, and to increase the oxygen dissolution rate from certain areas of the crucible wall by deforming crucible areas to form convex crucible wall areas.

As a consequence, it is possible to control the reduction in concentration of oxygen in a silicon melt from which an N-type silicon monocyrystalline ingot heavily doped with impurities and having a low resistivity is prepared, or in other words, to maintain, at a desired level, the concentration of oxygen in a silicon melt from which such an N-type silicon monocyrystalline ingot is prepared. Because this invention is based on a specific property characteristic with a quartz crucible which will soften while a monocrystalline silicon ingot is pulled, the seed terminal of the silicon ingot will retain the concentration of oxygen as determined by natural equilibrium conditions, while the full grown cylindrical portion and tail end of the same ingot will be relieved of the sharp decline in oxygen concentration which would result without the introduction of this invention.

DETAILED DESCRIPTION OF PREFERRED EMBODIMENTS

Next, a first embodiment of this invention will be described in detail with reference to accompanied drawings.

Figure 4:
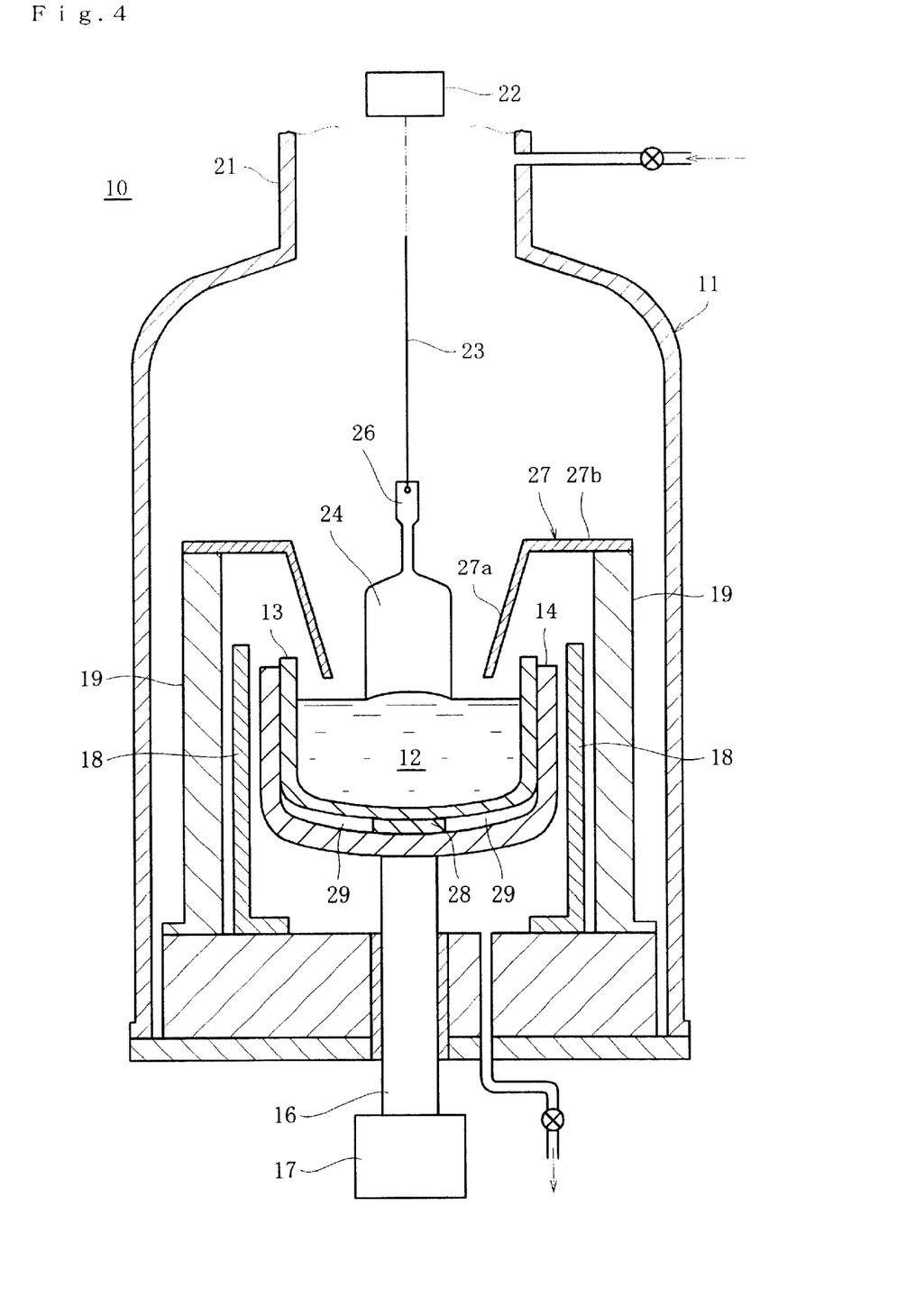
FIG. 4 is a schematic diagram of a crystal-pulling apparatus representing the first embodiment of this invention.

As shown in FIG. 4, a crystal-pulling apparatus 10 for pulling and growing a monocrystalline silicon ingot comprises a quartz crucible 13 for containing a silicon melt 12 in a chamber 11, and the quartz crucible 13 is covered in its base and side-wall by a graphite crucible container 14 for support. The crucible container 14 is fixed on the top end of a supporting axis 16, and the lower end of the supporting axis 16 is connected to a crucible driving means 17. The crucible driving means 17 comprises a first motor to rotate the quartz crucible 13 and a second motor to vertically move the quartz crucible 13, although the motors are not illustrated here. Through the actions of these motors, the quartz crucible 13 can be rotated in a desired direction, and can shift to and rest at any desired vertical level. The periphery of the crucible container 14 is surrounded by a heater 18, and the heater 18 is in turn surrounded by a heat reserving cylinder 19. The heater 18 is provided to heat a highly pure polycrystalline silicon material placed in the quartz crucible 13, to turn it into a silicon melt 12.

Further, a pulling means 22 is provided in a cylindrical casing 21 on the top end of chamber 11. The pulling means 22 comprises a pulling head (not illustrated here) rotatably and horizontally attached to the top end of casing 21, a second motor (not illustrated) for rotating the head, a wire cable 23 hanging down towards the rotation center of the quartz crucible 13, and a motor (not illustrated) mounted to the head for pulling a monocrystalline silicon ingot which is capable of taking up or releasing the wire cable 23. A crystal seed 26 is attached to the lowest end of wire cable 23. A heat insulating means 27 in the form of a cylinder is inserted between the periphery of a monocrystalline silicon ingot 24 and the internal surface of the heat reserving cylinder 19, so as to surround the monocrystalline silicon ingot 24. This heat insulating member 27 is constituted of a conical portion 27a and a flange portion 27b. Fixation of the heat insulating member 27 is achieved by attaching the flange portion 27b to the heat reserving cylinder 19.

Figure 1:
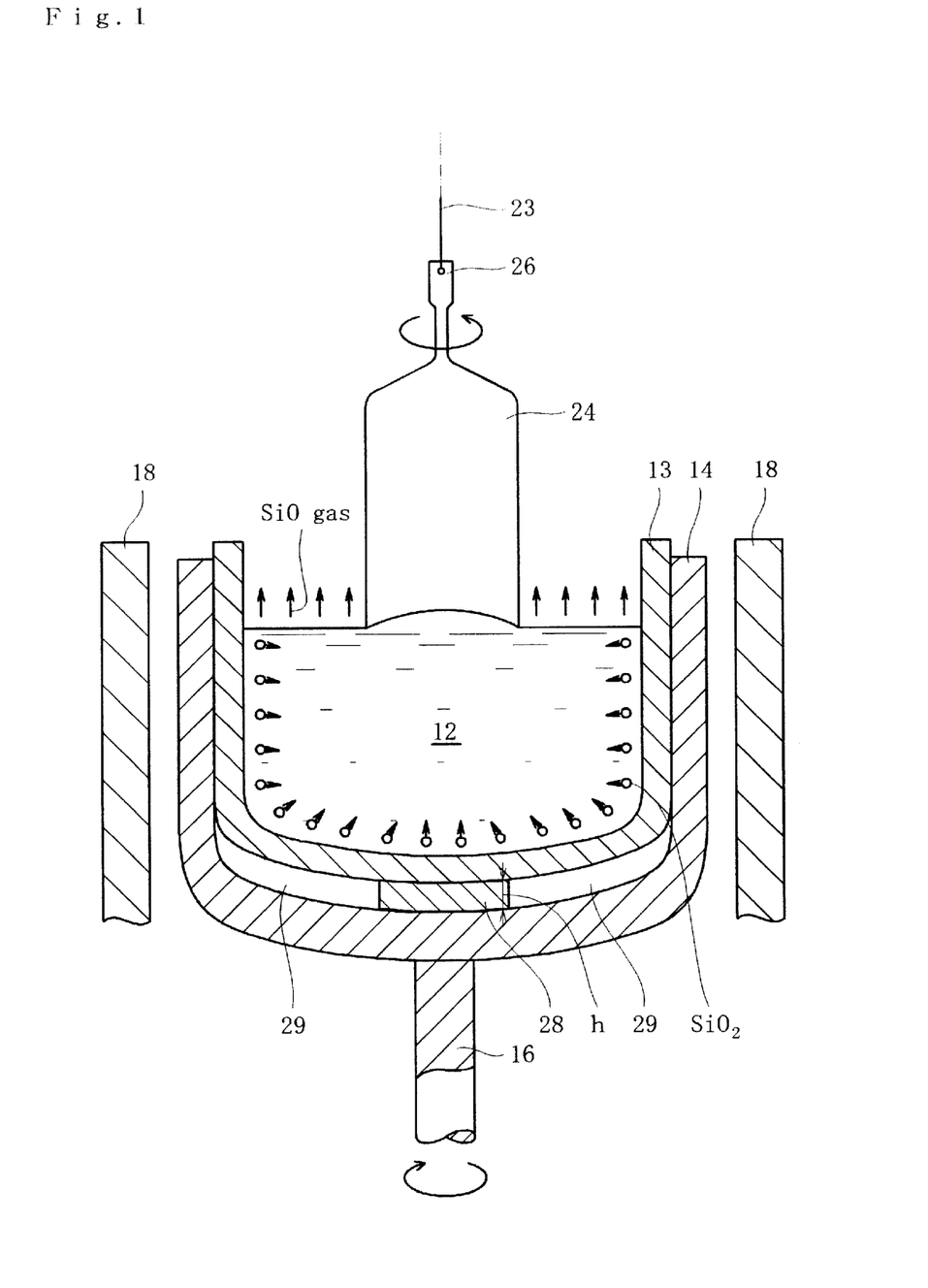
FIG. 1 is a cross-sectional view of the quartz crucible of a crystal-pulling apparatus representing a first embodiment of this invention, illustrating the crucible before it undergoes deformation.

A feature characteristic with this first embodiment is represented by the configuration of the apparatus as shown in FIG. 1, that is, a spacer 28 having a top area smaller than the base area of the quartz crucible 13 and having a higher melting point than that of silicon is inserted between the external base surface of the quartz crucible 13 and the internal base surface of the crucible container 14. Through the insertion of spacer 28 in this manner, a gap 29 is formed between the external base surface of the quartz crucible 13 and the internal base surface of the crucible container 14. If the top area of spacer 28 were equal to or larger than the area of the external base surface of the quartz crucible 13, a gap 29 would not be formed between the external base surface of the quartz crucible 13 and the internal base surface of the crucible container 14, and thus the base of crucible would not deform even if the quartz crucible softens by heating. If the spacer had a melting point lower than that of silicon, it would melt by heating before the quartz crucible 13 softens, thereby abolishing the merit characteristic with this invention. In this particular embodiment, the spacer 28 is one in number, and is made of a graphite material as in the crucible container 14. Further, the spacer 28 is a solid cylinder, and is fixed to the internal base surface of the crucible container 14 such that the center of the spacer coincides with that of the base of the crucible container 14. However, the spacer may be a solid cap, a ring or any other symetrical shape, or may not be fixed, although such spacers are not illustrated here.

The spacer 28 may take, by option, an appropriate form depending on the desired size of a monocrystalline silicon ingot 24, or on the desired oxygen concentration in the monocrystalline silicon ingot 24. Provided that the spacer 28 is fixed concentrically onto the internal base surface of the crucible container 14, it will not disturb, during heating, convection currents developed in a silicon melt 12 so much as to make them uneven, because then the base of the quartz crucible 13 will deform uniformly and symmetrically around the center of crucible 13. The thickness of the quartz crucible 13 may be determined as appropriate depending on the deformation speed of the constitutive material of the crucible or $SiO_2$.

Figure 5:
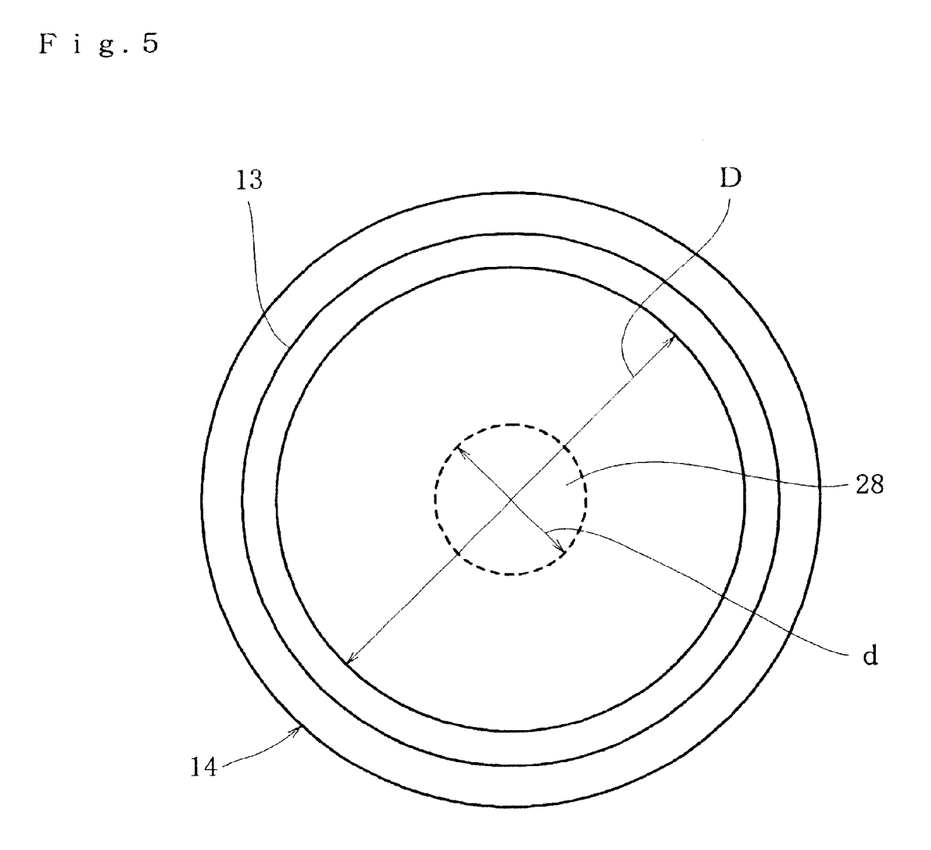
FIG. 5 is a flat view of the quartz crucible.

Provided that the quartz crucible 13 has an internal base surface whose diameter is D, and the spacer 28 has a diameter d and a height h, as shown in FIGS. 1 and 5, the D, d and h are preferably chosen so as to satisfy the following formulas (2) and (3) simultaneously.

$$D/12 \leq d \leq D/1.5 \quad (2)$$

$$D/100 \leq h \leq D/10 \quad (3)$$

More preferably, D, d and h are chosen to satisfy the formulas (4) and (5) simultaneously.

$$D/8 \leq d \leq D/2 \quad (4)$$

$$D/50 \leq h \leq D/20 \quad (5)$$

If the crucible and spacer are so prepared as to satisfy formulas (2) and (3) simultaneously and put into use, it will be possible:

to partially retard the downfall of the surface of the silicon melt 12 brought about in association with the pulling of a monocrystalline silicon ingot 24 which is conspicuous when the cylindrical portion of the ingot is formed, as compared with a conventional apparatus where no such spacer is introduced, and thus to avoid a sharp fall in the concentration of oxygen dissolved into the silicon melt 12 which would be otherwise brought about as a result of the pulling of a silicon crystal ingot, thereby maintaining the oxygen concentration in the melt at a relatively constant level, to increase the effective crucible surface area in contact with the silicon melt during the pulling of a monocrystalline silicon ingot 24 as compared with a conventional apparatus where no such spacer is introduced and, and thus to avoid a sharp fall in the concentration of oxygen dissolved into the silicon melt 12 which would be otherwise brought about as a result of the pulling of a silicon crystal ingot, and to change the dissolution rate of the quartz crucible surface in the areas that are affected by the deformation because of the spacer in a way that they form convex areas in contact with the silicon melt during the pulling of a monocrystalline silicon ingot 24 as compared with a conventional apparatus where no such spacer is introduced and, and thus to avoid a sharp fall in the concentration of oxygen dissolved into the silicon melt 12 which would be otherwise brought about as a result of the pulling of a silicon crystal ingot. If the spacer 28 were prepared such that its d and h are below the respective lower limits as defined above, and put into use, the deformation of the quartz crucible 13 would not be sufficiently great to restrain the reduction in the oxygen concentration of the silicon melt 12. If the spacer 28 having a diameter d larger than the upper limit as defined above were put into use, the deformation of the quartz crucible 13 would be so slight that the reduction in the oxygen concentration of the silicon melt 12 here concerned would not be practically prevented either. If the spacer 28 having a height h larger than the upper limit as defined above were put into use, the quartz crucible 13 would be so heavily deformed as to be exposed to the risk of destruction.

The method how to grow a monocrystalline silicon ingot using a crystal-pulling apparatus configured as above will be described below.

Firstly, a highly pure polycrystalline silicon material is transferred into a quartz crucible 13 to the brim, and a heater 18 is activated to heat the silicon material to a temperature above its melting point to turn the material into a melt 12. Next, a crystal seed 26 is dipped into the silicon melt kept in the quartz crucible 13. After the crystal seed itself has been melted, pulling of the seed is introduced by taking up a wire cable 23 attached to the seed while rotating the cable, which will result in the production of a monocrystalline silicon ingot 24 in the form of a solid cylinder. During pulling, the quartz crucible 13 is also rotated, however, in a direction opposite to that of the wire cable 23. When the melt is formed and when the cylindrical portion of monocrystalline silicon ingot 24 is formed, the quartz crucible 13 will slowly soften, being heated by the heater 18 to a softening temperature, and its base will gradually deform towards abolishing a gap 29. The base of the quartz crucible 13 thus deformed will have a sharper convexity on account of the presence of a spacer 28, and thus the area of the internal base surface of the quartz crucible 13 will increase. Thanks to this increased internal base area of the quartz crucible 13, the area of the internal base of the quartz crucible 13 in contact with the silicon melt 12 will also increase. In addition, the surface of the silicon melt 12 would be raised relative to a given level of the side-wall of crucible, if other conditions remain invariable. This implicit elevation of the surface of the silicon melt 12 relative to the side-wall of crucible 13 will retard the sharp downfall of the surface of the silicon melt 12 which would otherwise result particularly when the cylindrical portion of a monocrystalline silicon ingot 24 is formed. As a consequence, this will prevent the concentration of oxygen dissolved in the silicon melt 12 from sharply declining in association with the pulling of a monocrystalline silicon ingot which would otherwise result. A monocrystalline silicon ingot 24 obtained from a silicon melt 12 prepared as above will be relieved of the uneven distribution of the oxygen concentration along its longitudinal axis, for example, oxygen concentrations variously found at the seed end, cylindrical portion and tail end, that is, the problem observed in a monocrytalline silicon ingot obtained by a conventional crystal seed pulling process.

Figure 10:
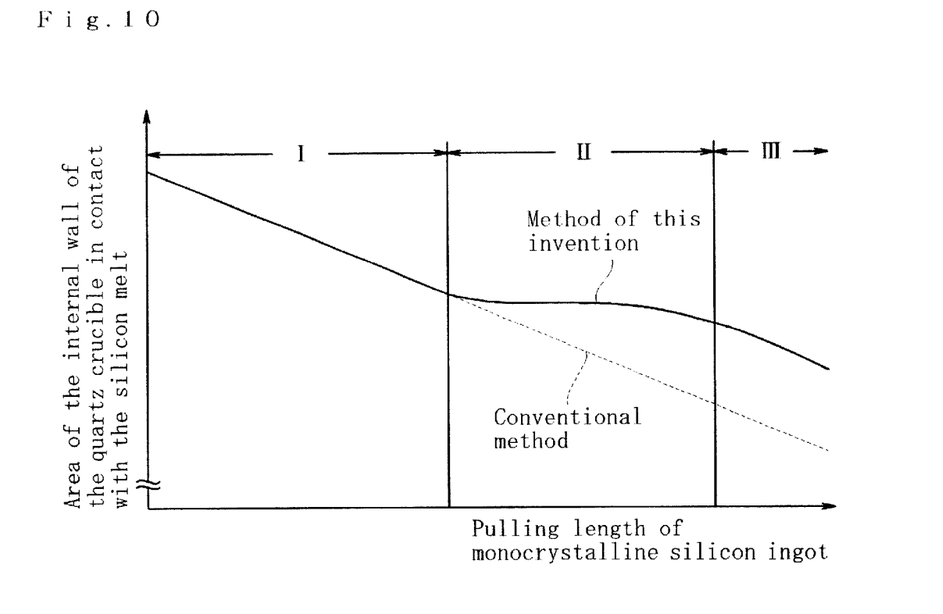
FIG. 10 is a graph representing the change of area of the internal wall of the quartz crucible in contact with a silicon melt, as a function of the pulling length of a monocrystalline silicon ingot in the first embodiment of this invention.

The area of the quartz crucible 13 in contact with the silicon melt 12 will decline at the approximately same speed as observed in a conventional process, until deformation of the crucible sets in, as indicated by FIG. 10 (phase I). When pulling of a crystal seed is started, the area of the quartz crucible 13 in contact with the silicon melt 12 is comparatively large, and thus the concentration of oxygen dissolved into the silicon melt 12 is sufficiently high. Moreover, the quartz crucible 13 will not have deformed sufficiently yet and the silicon melt 12 will maintain the concentration of oxygen determined by current natural equilibrium conditions.

Figure 2:
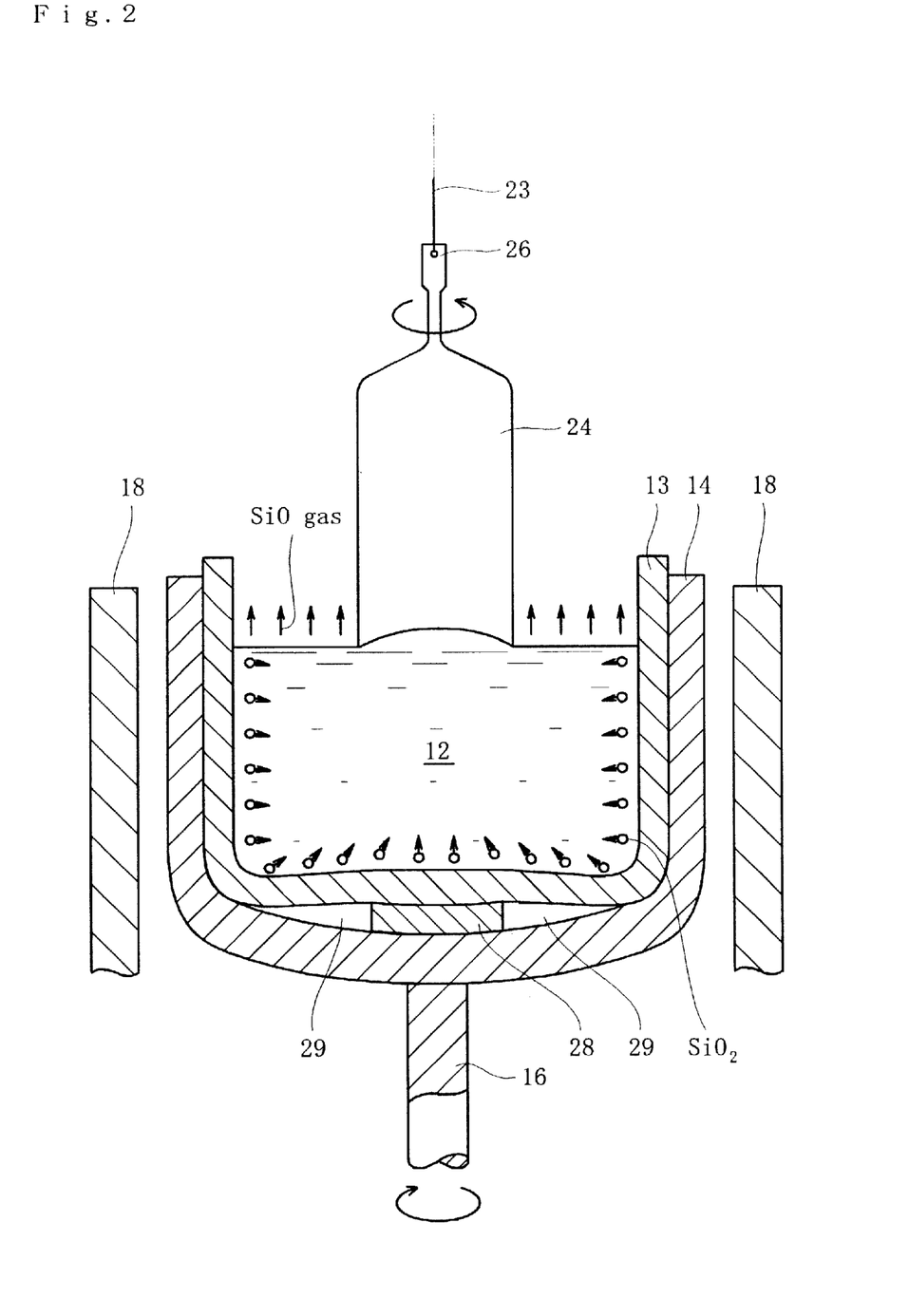
FIG. 2 is a view corresponding to FIG. 1 illustrating however the quartz crucible slightly deformed.

During the phase at which the melt is formed and at which the cylindrical portion is formed, the quartz crucible 13 will start to deform, being heated to its softening temperature, and as shown in FIG. 2, its base will gradually deform towards abolishing a gap 29. When the base of the quartz crucible 13 starts to deform, the internal base area of the quartz crucible 13 will be gradually enlarged, and have an increasingly sharp upward convexity. In association, the surface of the silicon melt 12 relative to a given level of the side-wall of crucible 13 would be raised if other things remain invariable, and this implicit elevation of the surface of the silicon melt 12 will retard the downfall of the same surface which would otherwise result in association with the formation of a monocrystalline silicon ingot. As a consequence, the declining slope in area of the internal side-wall of the quartz crucible 13 in contact with the silicon melt 12 which would otherwise result in association with the pulling of a monocrytalline silicon ingot is effectively moderated (phase II). Additionally in association with the increasingly sharp upward convexity of the crucible in the deformed areas we will encounter a change in the melt flow pattern and in the dissolution rate of oxygen from the deformed crucible areas Because the melt-crucible wall contact area is increased and because the oxygen dissolution rate into the melt in the deformed areas is increased we find that the increase in oxygen will proceed at the same pace with the deformation.

Figure 3:
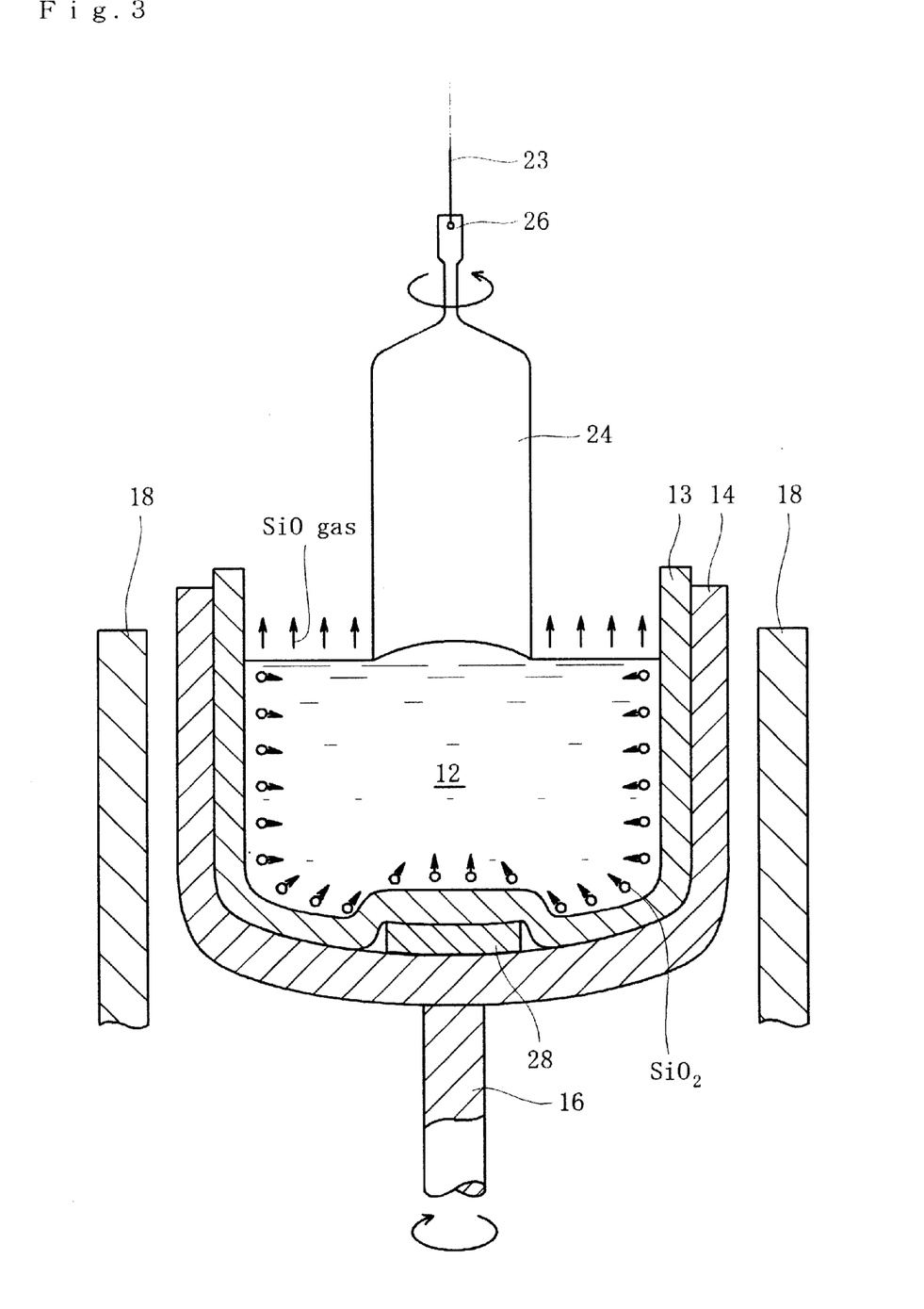
FIG. 3 is a view corresponding to FIG. 1 illustrating however the quartz crucible completely deformed.

As shown in FIG. 3, when the base of the quartz crucible 13 is completely deformed, the associated increase in the internal base area of the quartz crucible 13 and the implicit elevation of the surface of the silicon melt 12 will also cease. Then, the downfall of the surface of the silicon melt 12 in association with the pulling of a monocrystalline silicon ingot will proceed at the same speed as in a conventional apparatus. However, because the downfall of the surface of the silicon melt 12 is kept at a low level in phase II, the area of the quartz crucible 13 in contact with the silicon melt 12 will keep a high level as compared with the corresponding area in a conventional apparatus (phase III). Because deformation of the quartz crucible 13 introduced as above will encourage the dissolution of the oxygen from the crucible wall and the convection currents occurring at the solid-liquid interface between a monocrystalline silicon ingot 24 and the silicon melt 12 to contain more oxygen, and would raise the surface of the silicon melt relative to a given level of the side-wall of crucible if other things remain invariable, it will be also effective for restraining the reduction in the oxygen concentration of a silicon melt 12 doped with As and Sb which would otherwise result in association with the pulling of a crystalline silicon ingot.

Incidentally, phase I of FIG. 10 represents a period during which the area of the quartz crucible 13 in contact with the silicon melt 12 declines uniformly until deformation of the crucible sets in as a result of softening; phase II a period during which the contact area in question is kept relatively constant thanks to the deformation of the base of the quartz crucible 13; and phase III a period during which the decline in contact area sets in anew after the deformation of the base of the quartz crucible is completed.

As seen from the figure, according to the crystal-pulling apparatus 10 provided with a spacer 28, it is possible to maintain, during the early phase of pulling, the oxygen concentration of a monocrystalline silicon ingot at a level determined by natural equilibrium conditions, and, during the period at which the cylindrical portion and tail end of the monocrystalline silicon ingot are formed, to restrain, by a constant amount, the reduction in the oxygen concentration of the silicon melt which would otherwise brought about. Thus, the merit characteristic with this apparatus brought about by the deformation of the quartz crucible 13 which may be introduced in a timely manner at a period during which the cylindrical portion and tail end of a crystal silicon ingot are being formed is particularly useful when an $N^{++}$ type silicon monocyrystalline ingot heavily doped with impurities is prepared, because for the manufacture of such a silicon crystal ingot, the silicon melt must have a high oxygen concentration.

Next, a second embodiment of this invention will be described with reference to FIGS. 6 to 9. In those figures, constitutive elements corresponding to those in FIGS. 1 to 5 have the same symbols attached.

Figure 6:
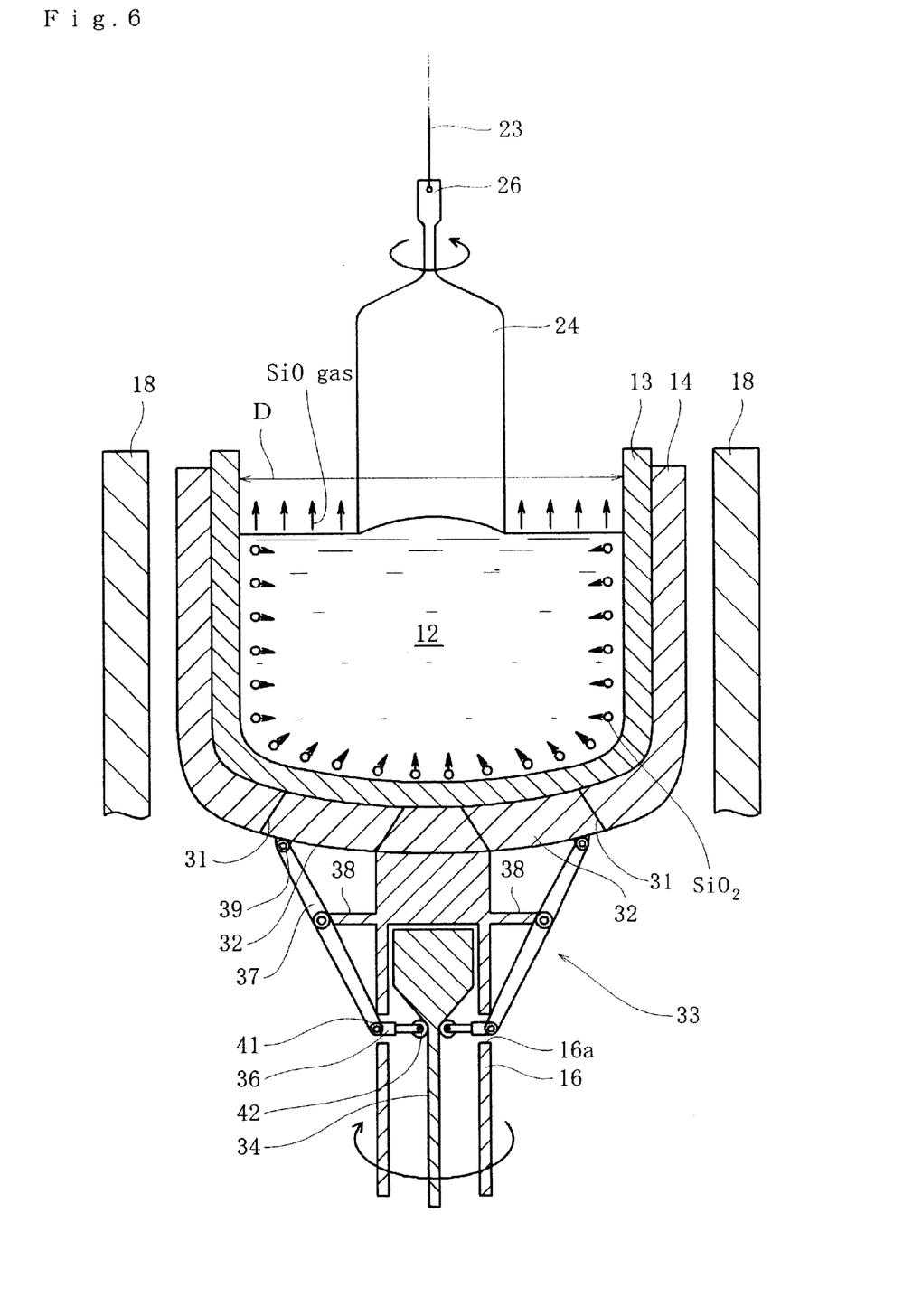
FIG. 6 is a cross-sectional view of the quartz crucible of a crystal-pulling apparatus representing a second embodiment of this invention, illustrating the crucible before it undergoes deformation.
Figure 8:
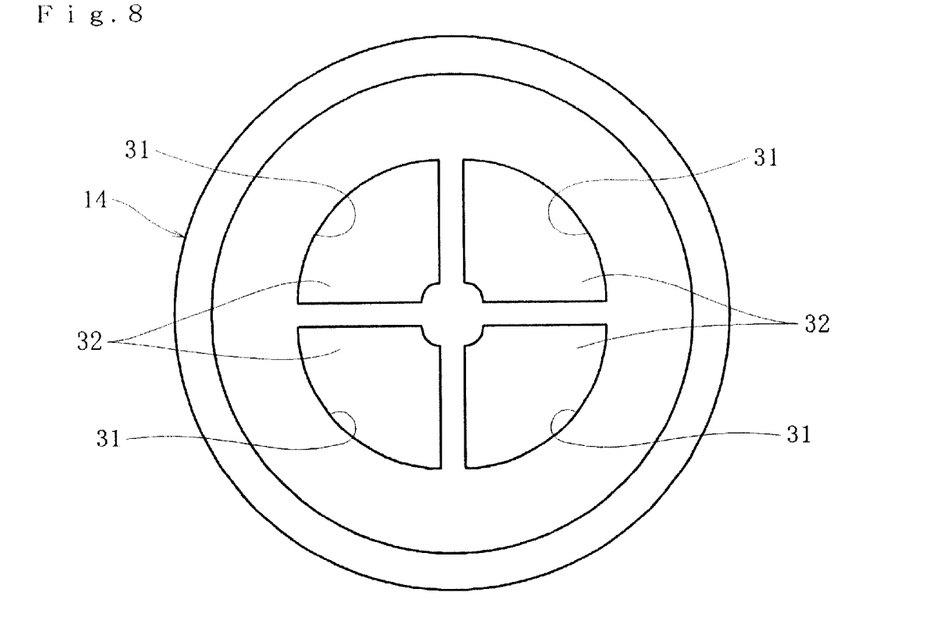
FIG. 8 is a flat view of a graphite susceptor.

The configuration characteristic with the second embodiment is represented by four openings 31 formed on the base of the crucible container 14 symmetrically around the center of the crucible container 14 as shown in FIGS. 6 and 8; four spacers 32 introduced into the openings 31 so as to completely occlude the latter; and a spacer disposing means 33 for raising and lowering the spacers which will raise the spacers from the openings 31 to a same height, or lower the spacers into the openings 31 to a same level. In this embodiment, each of the four openings 31 and spacers 32 has a shape of a sector when viewed from top, being the same in area.

The number of openings and spacers is not limited to four, but may be two, three, five or six, although such examples are not illustrated here. The preferred number of openings and spacers is from 3 to 12. The shape of the openings and spacers is not limited to a sector, but may be a circle or triangle, provided that the openings and spacers have the same shape and area. If plural openings had different shapes and areas, the base parts of the quartz crucible raised by spacers would become asymmetrically disposed to each other which would cause convection currents in the silicon melt to be unevenly disturbed.

Figure 9:
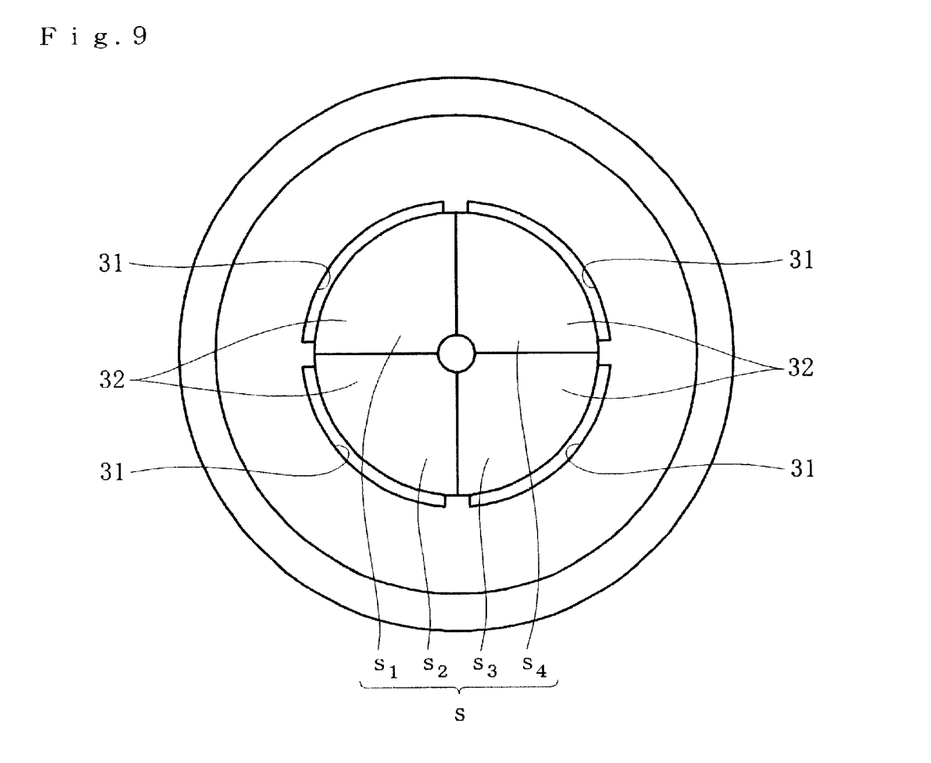
FIG. 9 is a view corresponding to FIG. 8 illustrating however how spacers are protruded.

As shown in FIGS. 8 and 9, four spacers 32 are arranged such that they are separated by a predetermined distance from each other, and their thickness becomes increasingly reduced as it approaches the center of the crucible base. The four spacers 32, when driven out from the openings 31, will unite together to form an annular body. Then, because the base of the quartz crucible 13 will be raised by the annular body or a combined ingot of four spacers 32, it will have an upward convexity with a moderate side slope.

As shown in FIG. 6, the spacer disposing means 33 comprises a linearly movable rod 34, passively moved bodies 36, levers 37, fixation arms 38, and pinions 42. Supporting stands 16 are formed hollowly, and comprise, within their confine, the linearly movable rod 34 capable of vertically moving along its longitudinal axis. The supporting stands 16 contain four windows 16a. To the outer surfaces of supporting stands 16 above the respective windows 16a, are vertically fixed four fixation arms 38. To the other end of each fixation arm 38 is rotatably attached a lever 37. The upper end of each lever 37 is attached via a pin 39 to the base of the spacer 32. The lower end of each lever 37 is attached via a pin 41 to the base end of the passively moved body 36. The other end of each passively moved body 36 has the pinion 42 to mesh with the teeth of linearly movable rod 34.

Figure 7:
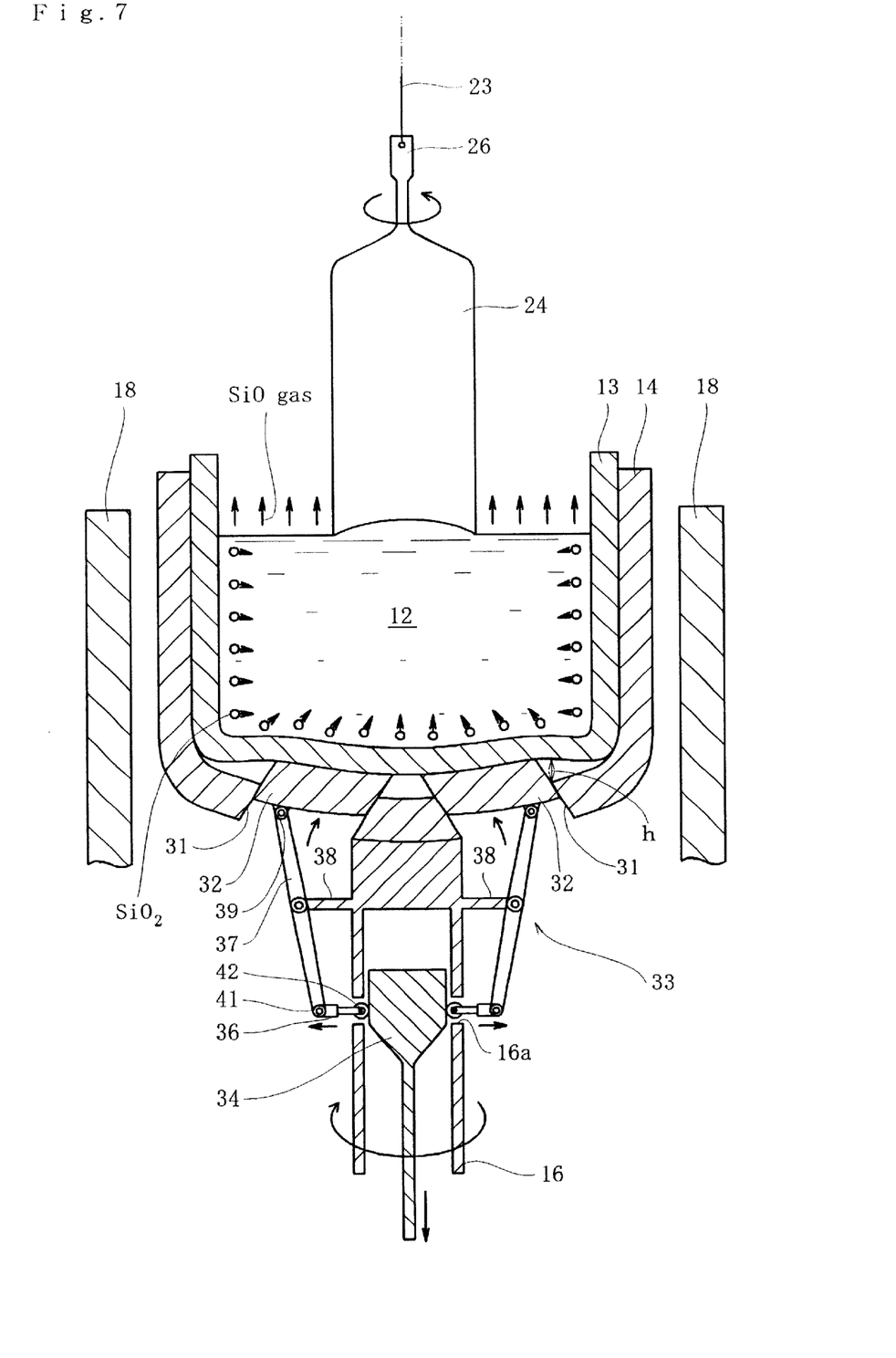
FIG. 7 is a view corresponding to FIG. 6 illustrating however the quartz crucible deformed in the presence of upward pressures introduced by protruding spacers.

Let's assume that the diameter of the internal base surface of the quartz crucible 13 be D, the total area of the top surfaces of plural spacers be s, and the protrusion height of all the spacers be h, and that the D, s and h satisfy the following formulas (6) and (7) simultaneously, as shown in FIGS. 7 and 9. In this particular embodiment, the top surfaces of four spacers 32 have areas $s_1$, $s_2$, $s_3$ and $s_4$, respectively, as shown in FIG. 9.

$$\{(D/2)^2\pi\}/12 \leq s \leq \{(D/2)^2\pi\}/1.5 \quad (6)$$

$$D/100 \leq h \leq D/5 \quad (7)$$

The D, s, h more preferably satisfy the following formulas (8) and (9).

$$\{(D/2)^2\pi\}/8 \leq s \leq \{(D/2)^2\pi\}/2 \quad (8)$$

$$D/50 \leq h \leq D/10 \quad (9)$$

If the crucible and spacer are so prepared as to satisfy formulas (6) and (7) simultaneously and put into use, it will be possible to retard the downfall of the surface of the silicon melt 12 brought about in association with the pulling of a monocrystalline silicon ingot 24 which is conspicuous when the cylindrical portion of the ingot is formed, as compared with a conventional apparatus where no such spacer is introduced, and thus to avoid a sharp fall in the concentration of oxygen dissolved into the silicon melt 12 which would be otherwise brought about as a result of the pulling of a silicon crystal ingot, thereby maintaining the oxygen concentration in the melt at a relatively constant level. Additional effects that result in the melt keeping their desired high oxygen content are based on the fact that the deformation of the crucible forms convex crucible areas that are more likely to introduce more oxygen into the melt because of the higher rate of oxygen dissolution in these areas and because the melt flow is being redirected by the crucible shape changes in a way that the higher oxygen containing melt is directed to the crystal growing interface. If the spacers 32 were prepared such that their total surface area s and height h are below the respective lower limits as defined above, and put into use, the deformation of the quartz crucible 13 would not be sufficiently great to restrain the reduction in the oxygen concentration of the silicon melt 12. If the spacers 32 were prepared such that their total surface area s is above the upper limit as defined above, and were put into use, the crucible container 14 would lose a sufficient strength to support the quartz crucible 13. Moreover, if the spacers 32 whose total surface area s exceeds the upper limit as defined above were used, the deformation of the quartz crucible 13 being forced by the protrusion of the spacers would be so small that the reduction in the oxygen concentration of the silicon melt 12 would be hardly restrained. If the spacers 32 whose height h exceeds the upper limit as defined above were used, the quartz crucible 13 would be so heavily deformed as to be exposed to the risk of destruction.

The method how to grow a monocrystalline silicon ingot using a crystal-pulling apparatus configured as above will be described below.

Firstly, a highly pure polycrystalline silicon material is transferred into a quartz crucible 13 to the brim, and a heater 18 is activated to heat the silicon material to a temperature above its melting point to turn the material into a melt 12. Next, a crystal seed 26 is dipped into the silicon melt 12 kept in the quartz crucible 13. After the crystal seed itself has been melted, pulling of the seed is introduced by taking up a wire cable 23 attached to the seed while horizontally rotating the cable, which will result in the production of a monocrystalline silicon ingot 24 in the form of a solid cylinder. During pulling, the quartz crucible 13 is also horizontally rotated, however, in a direction opposite to that of the wire cable 23. When the cylindrical portion of monocrystalline silicon ingot 24 is formed, the quartz crucible 13 will soften, being heated by the heater 18 to a softening temperature, and its base will gradually deform towards abolishing a gap 29.

According to this embodiment, in order to control the downfall of the surface of the silicon melt 12 brought about in association with the pulling of a monocrystalline silicon ingot, a linearly movable rod 34 or a constitutive element of a spacer disposing means 33 is pulled downward according to the pulling length of monocrystalline silicon ingot, thereby driving four spacers 32 out from four openings 31 to a same height. To put it more specifically, the linearly movable rod 34 is pulled downward along its longitudinal axis, thereby transferring motion to four pinions 42 as shown in FIG. 7. Four passively moved bodies 36 connected to the respective pinions 42 are pushed outward by this motion through the respective windows 16a. Each lever 37 whose lower end is connected to a passively moved body 36 is driven into motion by this movement with the joint with a fixation arm 38 as a pivot, to cause its upper end to move towards the center of the adjacent supporting stand 16. The combined activation of four levers 37 drives four spacers 32 out from their respective openings 31 to a same height. The four spacers 32 protruded simultaneously press the external base of the quartz crucible 13, and deform the base now sufficiently softened.

When deformation of the quartz crucible 13 sets in, the base of the quartz crucible 13 will have a sharper convexity on account of protruding four spacers 32, and thus the area of the internal base surface of the quartz crucible 13 will increase. Thanks to this increased internal base area of the quartz crucible 13, the area of the internal base of the quartz crucible 13 in contact with the silicon melt 12 will also increase. Due to the change in the shape of the crucible areas a higher oxygen dissolution from these deformed crucible areas will also result, as will a redirection of the high oxygen containing melt flow. In addition, the surface of the silicon melt 12 would be raised relative to a given level of the side-wall of crucible, if other things remain invariable. This implicit elevation of the surface of the silicon melt 12 relative to the side-wall of crucible 13 will restrain the sharp downfall of the surface of the silicon melt 12 which would otherwise result particularly when the cylindrical portion of a monocrystalline silicon ingot 24 is formed. As a consequence, this will prevent the concentration of oxygen dissolved into the silicon melt 12 from sharply declining in association with the pulling of a monocrystalline silicon ingot which would otherwise result. A monocrystalline silicon ingot 24 obtained from a silicon melt 12 prepared as above will be relieved of the uneven distribution of the oxygen concentration along its longitudinal axis, for example, oxygen concentrations variously found at the seed end, cylindrical portion and tail end, that is, the problem posed by a monocrytalline silicon ingot obtained by a conventional crystal seed pulling process. After a monocrystalline silicon ingot 24 has been pulled, the linearly movable rod 34 is pushed upward: then things proceed in the manner opposite to what is described above, that is, the spacers 32 will retreat into the respective openings 31.

Figure 11:
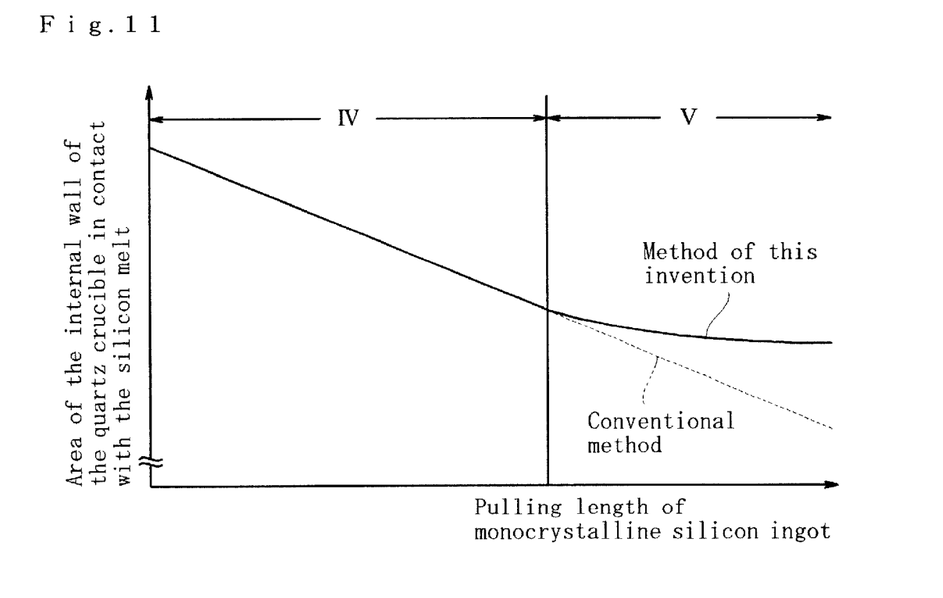
FIG. 11 is a graph representing the change of area of the internal wall of the quartz crucible in contact with a silicon melt, as a function of the pulling length of a monocrystalline silicon ingot in the second embodiment of this invention.

The area of the quartz crucible 13 in contact with the silicon melt 12 declines at the same speed as in a conventional apparatus as shown in FIG. 11, until deformation of crucible 13 sets in (phase IV). During the early phase of pulling, the contact area between the silicon melt 12 and the internal wall of the quartz crucible 13 is comparatively large, and thus the concentration of oxygen dissolving into the silicon melt 12 is sufficiently high. Moreover, because the quartz crucible 13 will not be deformed by the deformation mechanism, silicon melt 12 will maintain the concentration of oxygen determined by current natural equilibrium conditions.

During the phase at which the cylindrical portion is formed, the quartz crucible 13 will start to soften, being heated to its softening temperature. In this particular embodiment, even when the quartz crucible 13 reaches a highest softening point, activation of the spacer means 33 will be restrained to keep spacers 32 from protruding, as long as the area of crucible in contact with the silicon melt 12 is kept at a sufficiently high level to effectively retard the reduction in the oxygen concentration of the silicon melt 12. This contact area in question declines depending on the pulling length of a monocrystalline silicon ingot. Therefore, if the contact area falls below a specified value, or if the pulling length of a monocrystalline silicon ingot reaches a specified value, protrusion of spacers 32 is introduced. Thereupon, the base of the quartz crucible 13 will receive an upward shove, to be slowly deformed therewith as shown in FIG. 11. The deformation will bring about a gradual increase in the area of internal base surface of the quartz crucible 13, and, as the upward convexity of the internal base of crucible 13 is emphasized, the surface of the silicon melt 12 would rise if other things remain invariable. Because this implicit elevation of the surface of the silicon melt 12 will retard the downfall of the same surface which will be brought about in association with the pulling of a monocrystalline silicon ingot 24, the sharp reduction in area of crucible 13 in contact with the silicon melt 12 which would otherwise result will be effectively restrained (phase V). When protrusion of spacers 32 is discontinued, the associated deformation of the internal base area of the quartz crucible 13 and the implicit elevation of the surface of the silicon melt 12 will also cease. Because deformation of the quartz crucible 13 introduced as above will encourage convection currents occurring at the solid-liquid interface between a monocrystalline silicon ingot 24 and the silicon melt 12 to capture more oxygen, and will restrain the sinking tendency of the surface of the silicon melt 12, it will be also effective for restraining the reduction in the oxygen concentration of a silicon melt 12 doped with As and Sb which would otherwise result in association with the pulling of the crystalline silicon ingot. Phase IV of FIG. 11 represents a period during which the area of the quartz crucible 13 in contact with the silicon melt 12 will decrease at the approximately same speed as observed in a conventional process, until deformation of the crucible sets in, while phase V represents a period during which the contact area in question is kept relatively constant thanks to the deformed base of the quartz crucible 13.

According to this crystal-pulling apparatus 10, the spacer disposing means 33 can drive spacers 32 out from openings 31 or withdraw spacers 32 into openings 31. Thus, it is possible with this apparatus to cause the base of the quartz crucible 13 to be deformed by a desired amount according to the pulling length of a monocrystalline silicon ingot. This apparatus is designed for a quartz crucible 13 whose deformation elicited by heating alone will not proceed in a sufficiently timely manner to compensate for the reduction in the oxygen concentration of a silicon melt 12 in contrast with the first embodiment. Use of this apparatus will make it possible to control the sinking speed of the surface of the silicon melt 12 which will be brought about in association with the pulling of a monocrystalline silicon ingot 24, according to the pulling length of the silicon ingot 24, thereby making uniform the oxygen concentration in the monocrystalline silicon ingot 24 along its longitudinal axis.

What is claimed is:

1. A crystal-pulling apparatus for pulling and growing a monocrystalline silicon ingot comprising a quartz crucible placed in a chamber and containing a silicon melt from which a monocrystalline silicon ingot will be pulled, a graphite crucible container to support the quartz crucible by surrounding the outer circumferential surface and an external base surface of the crucible, and a heater which is provided around the outer circumferential surface of the crucible container to heat the silicon melt, wherein:

a spacer having a top surface whose area is smaller than the base area of the quartz crucible and having a melting point higher than that of silicon, is inserted between the base of the quartz crucible and the base of the crucible container while the monocrystalline silicon ingot is pulled.

2. The crystal-pulling apparatus of claim 1 wherein the spacer counts one, has a shape of a solid cylinder or a solid cap, and is fixed to the internal base of the crucible container such that the center of the spacer coincides with that of the internal base of the susceptor.

3. The crystal-pulling apparatus of claim 2 wherein, provided that the diameter of the internal base of the quartz crucible be D, the diameter of spacer d, and the height of spacer h, the D, d and h simultaneously satisfy the following formulas (2) and (3):

$$D/12 \leq d \leq D/1.5 \quad (2)$$

$$D/100 \leq h \leq D/10 \quad (3).$$

4. A crystal-pulling method for pulling and growing a monocrystalline silicon ingot based on the use of a crystal-pulling apparatus as described in claim 3 wherein a spacer is mounted or fixed before pulling of a crystal seed is started; and then pulling of the crystal seed is carried out for growing a monocrystalline silicon ingot while the spacer is kept as above.

5. A crystal-pulling method for pulling and growing a monocrystalline silicon ingot based on the use of a crystal-pulling apparatus as described in claim 2 wherein a spacer is mounted or fixed before pulling of a crystal seed is started; and then pulling of the crystal seed is carried out for growing a monocrystalline silicon ingot while the spacer is kept as above.

6. The crystal-pulling apparatus of claim 1 wherein a plurality of openings are formed on the base of the crucible container symmetrically around the center of the susceptor; the plurality of spacers are provided such that the spacers fill the cavity of the openings; and a spacer disposing means is provided for driving the spacers out from the openings to a same height, or for withdrawing the spacers into the openings.

7. The crystal-pulling apparatus of claim 6 wherein the plurality of openings have the same shape and size, and count 3 to 12.

8. The crystal-pulling apparatus of claim 7 wherein the plurality of openings count three to 12×; each of the openings and spacers has a shape of a sector when viewed from above; and the plurality of spacers, when driven out from the openings, unite together to take an annular shape.

9. The crystal-pulling apparatus of claim 8 wherein, provided that the diameter of the internal base of the quartz crucible be D, the total area of the top surfaces of plural spacers s, and the protrusion height of plural spacers h, the D, s and h simultaneously satisfy the following formulas (6) and (7):

$$\{(D/2)^2\pi\}/12 \leq s \leq \{(D/2)^2\pi\}/1.5 \quad (6)$$

$$D/100 \leq h \leq D/5 \quad (7).$$

10. A crystal-pulling method for pulling and growing a monocrystalline silicon ingot based on the use of a crystal-pulling apparatus as described in claim 7 comprising the steps of:

driving out a plurality of spacers from the plurality of openings with a spacer disposing means according to the pulling length of a monocrystalline silicon ingot from a quartz crucible; and withdrawing the plurality of spacers into the plurality of openings with the spacer disposing means after pulling of the monocrystalline silicon ingot is completed.

11. A crystal-pulling method for pulling and growing a monocrystalline silicon ingot based on the use of a crystal-pulling apparatus as described in claim 8 comprising the steps of:

driving out a plurality of spacers from the plurality of openings with a spacer disposing means according to the pulling length of a monocrystalline silicon ingot from a quartz crucible; and withdrawing the plurality of spacers into the plurality of openings with the spacer disposing means after pulling of the monocrystalline silicon ingot is completed.

12. A crystal-pulling method for pulling and growing a monocrystalline silicon ingot based on the use of a crystal-pulling apparatus as described in claim 7 comprising the steps of:

driving out a plurality of spacers from the plurality of openings with a spacer disposing means according to the pulling length of a monocrystalline silicon ingot from a quartz crucible; and withdrawing the plurality of spacers into the plurality of openings with the spacer disposing means after pulling of the monocrystalline silicon ingot is completed.

13. A crystal-pulling method for pulling and growing a monocrystalline silicon ingot based on the use of a crystal-pulling apparatus as described in claim 6 comprising the steps of:

driving out a plurality of spacers from the plurality of openings with a spacer disposing means according to the pulling length of a monocrystalline silicon ingot from a quartz crucible; and withdrawing the plurality of spacers into the plurality of openings with the spacer disposing means after pulling of the monocrystalline silicon ingot is completed.

14. A crystal-pulling method for pulling and growing a monocrystalline silicon ingot based on the use of a crystal-pulling apparatus as described in claim 1 wherein a spacer is mounted or fixed before pulling of a crystal seed is started; and then pulling of the crystal seed is carried out for growing a monocrystalline silicon ingot while the spacer is kept as above.

* * * * *